United States Patent [19]
Frazier

[11] Patent Number: 5,199,087
[45] Date of Patent: Mar. 30, 1993

[54] OPTOELECTRONIC INTEGRATED CIRCUIT FOR TRANSMITTING OPTICAL AND ELECTRICAL SIGNALS AND METHOD OF FORMING SAME

[75] Inventor: Gary A. Frazier, Garland, Tex.

[73] Assignee: Texas Instruments Incorporated, Dallas, Tex.

[21] Appl. No.: 816,505

[22] Filed: Dec. 31, 1991

[51] Int. Cl.⁵ .................. G02B 6/12; H01L 21/70; H01L 27/02; C03B 11/08
[52] U.S. Cl. .................................. 385/14; 385/49; 385/33; 385/35; 385/89; 385/93; 385/96; 437/51; 437/60; 65/36; 65/37; 257/432; 257/433
[58] Field of Search ............ 385/14, 49, 33, 35, 385/36, 88, 89, 92, 93, 94, 96, 139; 437/51, 54, 60; 65/36, 37; 357/16, 17, 19, 30, 40, 74, 75

[56] References Cited

U.S. PATENT DOCUMENTS

| | | | |
|---|---|---|---|
| 3,777,154 | 12/1973 | Lindsey | 385/14 |
| 4,188,708 | 2/1980 | Frederiksen | 385/14 |
| 4,373,778 | 2/1983 | Adham | 250/227.11 |
| 4,383,731 | 5/1983 | Simon et al. | 385/92 |
| 4,695,120 | 9/1987 | Holder | 250/227.11 |
| 4,732,446 | 3/1988 | Gipson et al. | 385/49 |
| 4,953,930 | 9/1990 | Ramsey et al. | 385/147 |
| 5,009,476 | 4/1991 | Reid et al. | 385/14 |
| 5,054,870 | 10/1991 | Losch et al. | 385/14 |

*Primary Examiner*—Brian Healy
*Attorney, Agent, or Firm*—Richard A. Stoltz; James C. Kesterson; Richard L. Donaldson

[57] ABSTRACT

A package receives and encapsulates an optoelectronic integrated circuit chip. A plurality of optically transmissive filaments have first ends coupled with the chip and second ends opposite the first ends positioned outside the package. In a preferred embodiment, the first ends are flamed off to form spherical lenses, which are then used to contact optically active devices on the integrated circuit chip.

34 Claims, 2 Drawing Sheets

OPTOELECTRONIC INTEGRATED CIRCUIT FOR TRANSMITTING OPTICAL AND ELECTRICAL SIGNALS AND METHOD OF FORMING SAME

TECHNICAL FIELD OF THE INVENTION

The present invention relates generally to integrated circuits and more particularly to optoelectronic integrated circuits transmitting optical and electrical signals.

BACKGROUND OF THE INVENTION

Conventional electronic integrated circuits generally comprise an integrated circuit chip encapsulated in a package with a plurality of external metal pins that are insertable in a socketed circuit board. Lead wires connect the chip circuitry to the metal pins for transmitting or receiving electrical signals. An example of a conventional integrated circuit is a dual inline package (DIP), which has two parallel rows of external metal pins.

Optoelectronic integrated circuit chips transmit and receive both electrical and optical signals. A need exists for an optoelectronic integrated circuit having external pins that can be removably inserted into a socketed circuit board for transmitting optical and electrical signals. A need also exists for a method of coupling an optically transmissive filament to an optoelectronic integrated circuit chip to provide a secure mechanical bond and high optical coupling efficiency.

SUMMARY OF THE INVENTION

According to one aspect of the invention, an optoelectronic integrated circuit includes an integrated circuit chip. A package having a cavity in the chip receives and encapsulates the chip. A plurality of optically transmissive filaments have first ends coupled to the chip and second ends opposite the first ends positioned outside of the package. The second ends are insertable into a socketed circuit board for transmitting optical signals to the circuit board.

According to another aspect of the invention, a leadless optoelectronic integrated circuit includes an integrated circuit chip. A plurality of optically transmissive filaments each have first and second ends. The first ends are coupled to the chip. The package is provided that has a cavity for receiving and encapsulating the chip and the filaments. The filaments are positioned in the package such that the second ends of the filaments are exposed to optical wave guides in a circuit board for the transmission of optical signals to and from the circuit board.

The present invention confers a technical advantage in that an integrated circuit package is provided with more than one optical coupling to the circuit board. Another technical advantage is that a plurality of optoelectronic connections are available in a standard dual inline chip package or other conventional chip package by making the optical filaments co-axial with the conductive pins. Another technical advantage of the invention is the provision of a leadless chip carrier having optical filaments terminating along the edges thereof, such that optical transmissions are possible to wave guides within the printed circuit board.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1:
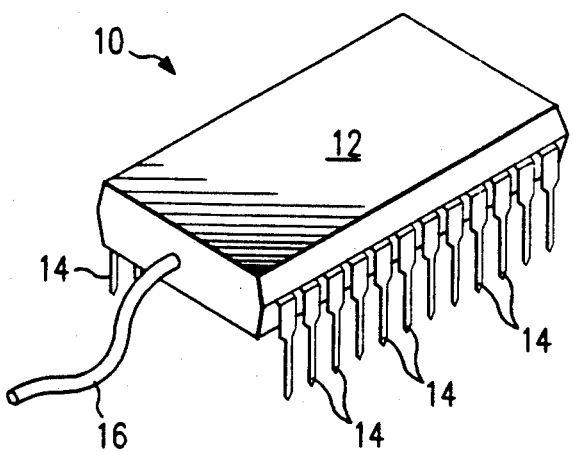
FIG. 1 is an isometric view of an optoelectronic integrated circuit constructed in accordance with the prior art.

FIG. 1 illustrates a prior art optoelectronic integrated circuit generally indicated by reference character 10. The optoelectronic circuit 10 comprises a (typically plastic) external integrated circuit package 12, in which is mounted a optoelectronic integrated circuit chip (not shown). The integrated circuit chip is connected to a plurality of leads (not shown), which are in turn connected to metal pins 14 that extend out of the package 12. The metal pins 14 are designed for insertion into a socketed system like a socketed circuit board (not shown) for transmission of electrical signals. The optoelectronic chip is also connected to a fiber optic pigtail 16, which extends out of the package 12 for receiving or transmitting optical signals.

Figure 2:
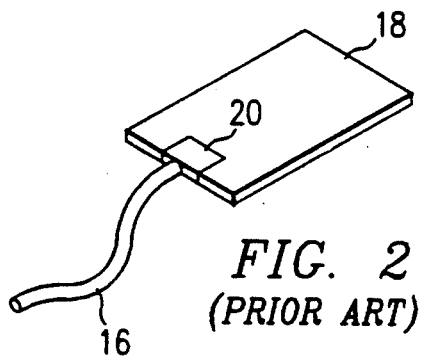
FIG. 2 is an enlarged view of the coupling of a fiber optic filament and an optoelectronic integrated circuit chip in accordance with the prior art.

FIG. 2 is an enlarged view of the connection of an optoelectronic integrated circuit chip 18 with an end of the fiber optic pigtail 16 within the package 12. The connection is made in accordance with the prior art. The pigtail 16 is optically connected with a light emitting or light detecting device 20 on the chip 18, such as a laser. To obtain the optical connection, an end of the pigtail 16 is positioned in intimate contact with the device 20. The end of the pigtail 16 is then bonded to the device 20 with epoxy to form a mechanical connection. FIGS. 1 and 2 are illustrative of prior art optoelectronic devices, which typically include a plurality of electrical connections to a circuit board, and a single optical pigtail used to make an optical connection. Prior art optical electronic devices typically have optical filaments bonded to the lateral edges of the optoelectronic chip 18.

Figure 3:
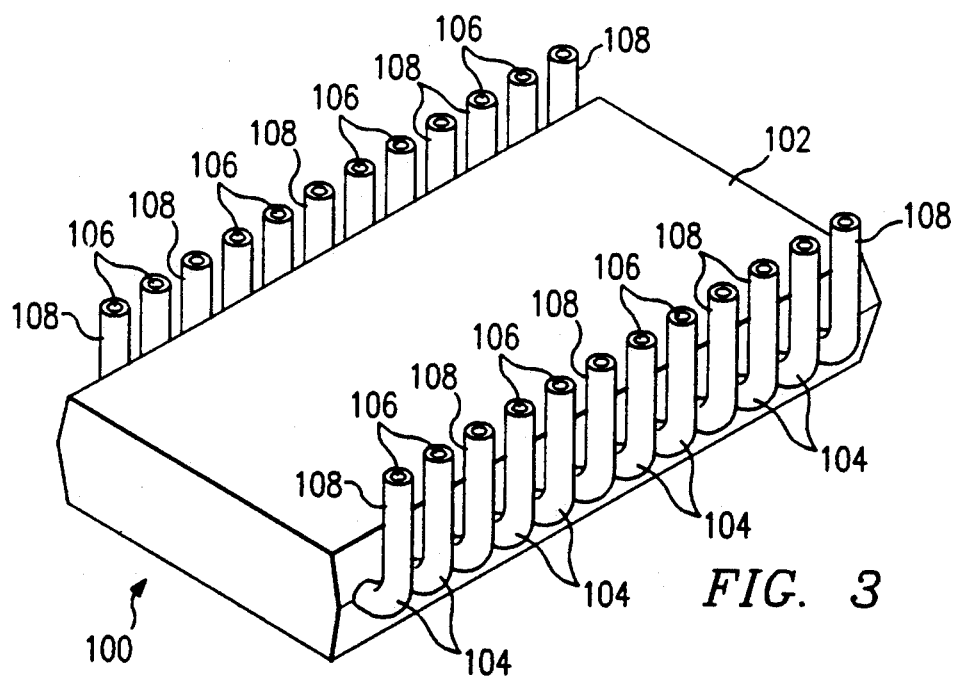
FIG. 3 is a three dimensional view of an optoelectronic integrated circuit constructed in accordance with one embodiment of the invention.

FIG. 3 illustrates an optoelectronic integrated circuit generally indicated by reference character 100 and constructed in accordance with one embodiment of the invention. The integrated circuit 100 includes an outer package 102, which houses an optoelectronic integrated circuit chip (not shown) and which can be fabricated of plastic, ceramic or other electrically insulating material. A plurality of optoelectronic pins 104 extend out of the package 102. Each of the pins 104 is optically and electrically connected to the chip. This connection will be discussed in greater detail with reference to FIG. 5. Each pin 104 comprises a fiber optic filament 106 as sheathed in a tubular metal shell 108 for transmitting both optical and electrical signals, respectively. The pins 104 are removably insertable in a socketed optoelectronic circuit board (not shown). Note that while FIG. 3 shows a circuit having a dual inline pin arrangement, any of a variety of other pin arrangements may be used.

Figure 4:
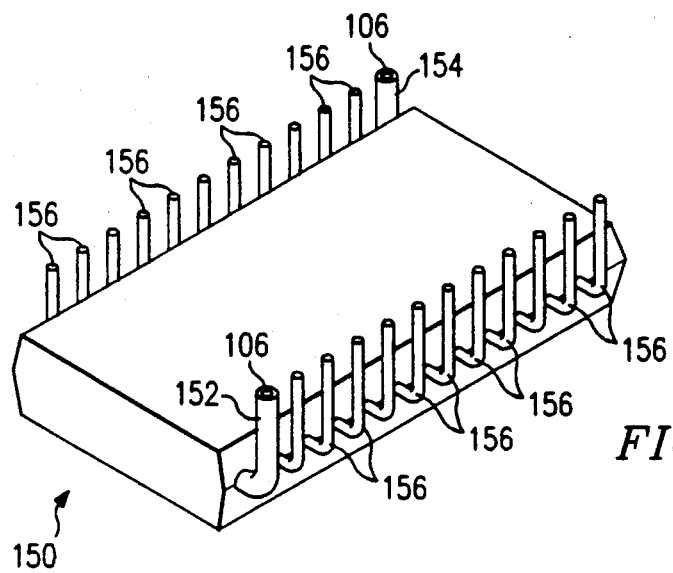
FIG. 4 is a perspective view of an optoelectronic integrated circuit constructed in accordance with a second embodiment of the invention.

A related embodiment of the invention is shown in FIG. 4, which is an isometric view of a dual inline package 150. Unlike the dual inline package 100 shown in FIG. 3, package 150 has only two metal pins: a metal pin 152 and a metal pin 154 which may, for example, be mounted on a corner of the package 150 opposite metal pin 152. Pins 152 and 154 provide power supplies to the circuitry encapsulated within the package 150. Pins 152 and 154 are hollow and each contain an optical filament 106. A plurality of other filaments 156 are connected to the integrated circuit chip in a manner to be described below, and are pigtailed out in a dual inline arrangement without being sheathed by metal pins like pins 152 and 154. This embodiment may be used, for example, where the optoelectronic circuit encapsulated has entirely optical communications with the outside world, and only requires electrical lines to provide power for the operation of the devices on the chip.

In another embodiment (not shown) the metal or conductive shells 108 can be replaced with solid conductive plates or wires with which the optical filaments 106 would be colinear.

Figure 5:
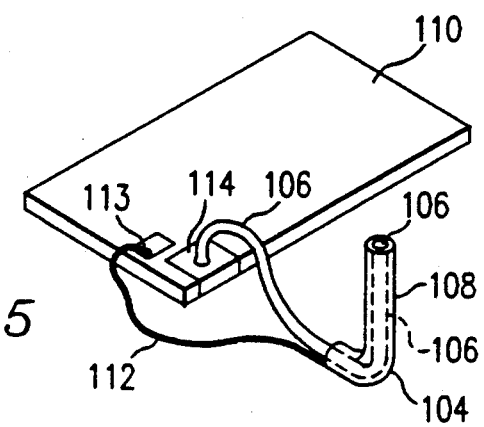
FIG. 5 is an enlarged view of the connection of an optoelectronic integrated circuit chip and an optoelectronic pin in accordance with one embodiment of the invention.

FIG. 5 illustrates a coupling between an optoelectronic integrated circuit chip 110 and an optoelectronic pin 104. An electric lead wire 112 is bonded to a bond pad 113 on the chip 110 and is connected as by soldering to the metal pin shell 108 for transmitting electrical signals The fiber optic filament 106 has a large portion of its length (indicated in phantom) sheathed in the metal shell 108 and has an interior end coupled to an active region of light emitting or detecting device 114 on the chip 110 for transmitting optical signals.

Figure 6:
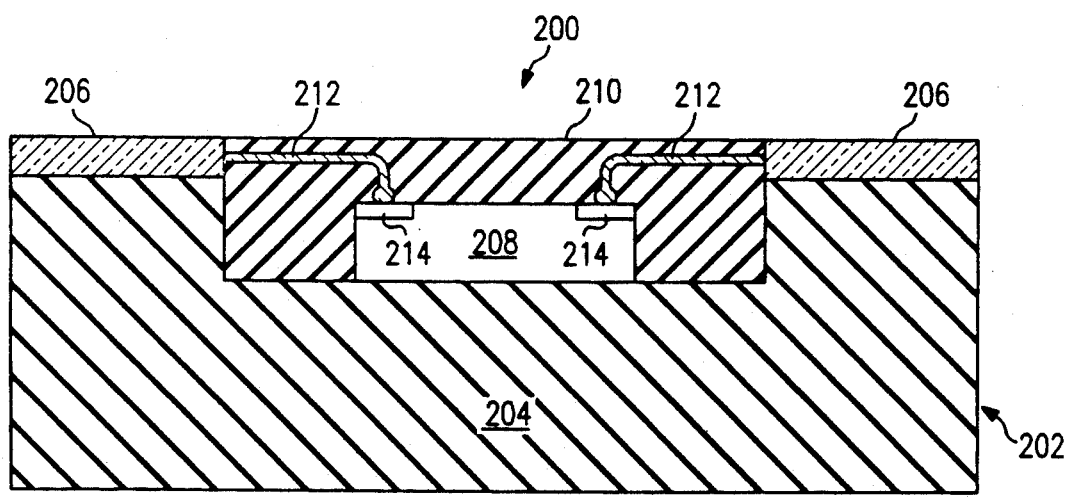
FIG. 6 is a cross-sectional view of a leadless optoelectronic integrated circuit chip carrier constructed in accordance with one embodiment of the invention.

FIG. 6 is a sectional view of a leadless optoelectronic integrated circuit indicated generally at 200 and constructed in accordance with an alternative embodiment of the invention The leadless circuit 200 is shown in FIG. 6 as it is mounted in an optical circuit board generally indicated by reference character 202. The optical circuit board 202 comprises an insulative or semi-insulative substrate 204, on which are formed optical wave guide channels 206 arranged for transmitting optical signals across the board 202. The leadless chip carrier 200 differs from the optoelectronic integrated circuit 100 shown in FIGS. 3 and 4 in that it does not include a plurality of external pins such as pins 104. The leadless circuit 200 includes an optoelectronic integrated circuit chip 208, which is encapsulated in a package 210 by plastic of other suitable encapsulating material. A plurality of fiber optic filaments 212 have ends coupled with light emitting or detecting devices 214 on the chip 208 for transmitting and receiving optical signals. The opposite ends of the filaments 212 are positioned at the faces or edges of the package 210 and are optically aligned to the wave guide channels 206 formed on the circuit board 202 to permit optical transmission. The circuit board 202 is designed to receive the package 210 such that the exposed ends of the filaments 212 are in intimate contact with the wave guide channels 206 to form a proper optical connection While in the preferred embodiment the transmissive faces of the package 210 are perpendicular to the surface of the circuit board 202, other angles may be chosen.

In another embodiment (not shown), the distal ends of the optical filaments 212 may be slightly recessed from the respective faces of the chip carrier 210, so as to prevent damage. Whether slightly recessed or completely flush with their respective faces, it is preferred that the distal ends of the optical filaments 212 be substantially coplanar with their respective faces of the chip carrier so as to optimize the transmission efficiency between each filament 212 and its respective optical wave guide channel 206.

It is preferred that the filaments 212 and the wave guide channels 206 on the optical circuit board 204 be of materials which have a similar index of refraction so as to obtain the greatest transmission efficiency of light between a filament 212 and a respective wave guide channel 206.

Figure 7:
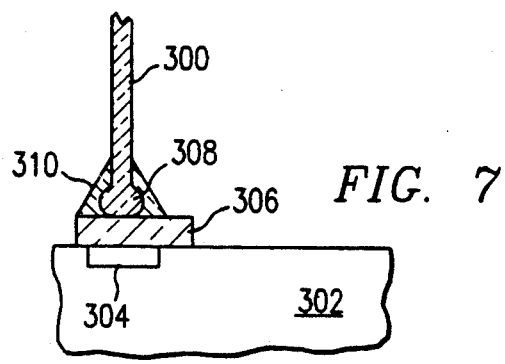
FIG. 7 is a cross-sectional view of a connection of a fiber optic filament to an optoelectronic integrated circuit chip in accordance with one embodiment of the invention.

FIG. 7 illustrates the coupling of a fiber optic filament 300 with an optoelectronic integrated circuit chip 302 in accordance with one embodiment of the invention. The chip 302 includes an optically active device 304 which may either emit or detect light, such as a light-emitting diode, laser or photodiode, for transmitting or receiving optical signals through the filament 300. To make the connection, a layer 306 is first formed, as by deposition, over the light emitting or detecting device 304. Layer 306 is optically transparent and should be formed of a material compatible with the semiconductor substrate 302; where substrate 302 is silicon layer 306 may be silicon dioxide; where substrate 302 is gallium arsenide layer 306 may be silicon nitride. In another embodiment, the transparent layer 306 may be formed of a plastic material that would have a lower melting point than the melting point of the filament 300. In this embodiment (not shown) the filament 300 would be pressed into or through the transmissive layer 306 to effect a physical connection to the chip 302. In the embodiment illustrated in FIG. 7, the end of the filament 300 is flamed off, forming a spherical bead or lens 308. The spherical lens 308 is then fused by pressure to the silicon dioxide layer 306. It has been found that this coupling method forms a highly efficient optical coupling between the filament and the chip and at the same time provides a secure mechanical bond.

It is preferable to bond the filament 300 to the layer of silicon dioxide 306 as glass bonds particularly well with glass. Methods of fusing glass with glass are well known. While silicon dioxide glass is particularly preferred, the materials of lens 308 and layer 306 should be chosen for their fusability with each other and their similarity in indices of refraction.

The physical bond between the spherical lens 308 and the layer 306 may be strengthened by applying epoxy 310 over the lens 308 and the layer 306. If unclad optical filaments such as pure silica are used for 300, the epoxy 310 is chosen to have a lower refractive index than the filament at the operating wavelength to minimize optical losses.

While not shown, the filament 300 may be directly bonded to the light emitting or detecting device 304 without application of the silicon dioxide layer 306.

It should be noted that while embodiments described above show the use of fiber optic filaments made of quartz material, any optically transmissive filament may be used, including those comprising plastics or other organic polymers. A fiber optic filament 300 and spherical lens 308, as comprised of plastic, may be physically bonded to the layer 306 or, alternatively, to the device 304 through physical pressure. The application of physical force to a plastic filament 300 will cause deformation of the spherical lens 308 and a robust physical connection to the layer or device. The surface of layer 306 or device 304 can be chemically etched to produce a roughened surface to improve adhesion of lens 308.

A technical advantage of the present invention is that it enables an optoelectronic integrated circuit chip to be removably connected to a socketed circuit board for transmitting electrical and optical signals.

Another technical advantage of the present invention is that it enables an optical filament to be securely bonded to an optoelectronic integrated circuit chip for transmitting optical signals. A further technical advantage of the present invention is that it forms a high efficiency optical coupling between a fiber optic filament and an integrated circuit chip.

In summary, novel optoelectronic circuits and packages have been shown and described which allow a multiplicity of optical communication paths to the same integrated circuit.

Although the present invention has been described with respect to specific embodiments, various changes and modifications may be suggested to one skilled in the art and it is intended that the present invention encompasses such changes and modifications as fall within the scope of the appended claims.

What is claimed is:

1. An optoelectronic integrated circuit, comprising:
   an integrated circuit chip;
   a package having a cavity therein for receiving and encapsulating said chip; and
   a plurality of optically transmissive filaments having first ends coupled with said chip and second ends opposite said first ends positioned outside said package, said second ends insertable into a socketed circuit board for transmitting optical signals
   a plurality of pins extending from said package and each including a conductor, a plurality of electrically conductive lead wires connected to said chip and coupled with said respective ones of said conductors, said conductors aligned with respective ones of said filaments for transmitting optical and electrical signals to said circuit board.

2. The optoelectronic integrated circuit of claim 1, wherein said conductors comprise a plurality of metal shells for sheathing said second ends of said filaments, said metal shells connected to said lead wires for transmitting electrical signals.

3. The optoelectronic integrated circuit of claim 1, wherein said second ends of said filaments are positioned in a dual inline arrangement.

4. The optoelectronic integrated circuit of claim 1, wherein said chip includes light emitting or light detecting devices and said first ends of said filaments are coupled with said light emitting or light detecting devices.

5. The optoelectronic integrated circuit of claim 1, wherein said first ends of said filaments comprise spherical lenses.

6. The circuit of claim 5, wherein said integrated circuit chip includes a plurality of optoelectronic devices having optically active areas formed at least one face of the chip; and
   for each device, an optically transmissive layer formed on said face said layer formed of a material which is fusible with at least a respective one of said spherical lenses.

7. The circuit of claim 6, wherein said layer and said filaments comprise silicon dioxide.

8. The circuit of claim 6, wherein said chip comprises gallium arsenide.

9. An optoelectronic integrated circuit, comprising:
   an optoelectronic integrated circuit chip;
   a package having a cavity therein for receiving and encapsulating said chip;
   a plurality of optically transmissive filaments having first ends coupled to said chip and second ends opposite said first ends positioned exterior to said package;
   a plurality of electrically conductive leads having first and second ends, said first ends coupled to said chip; and
   a plurality of metal shells sheathing said second ends of said filaments and connected to said second ends of said leads to form optoelectronic pins insertable in a socketed circuit board for transmitting optical and electrical signals.

10. The optoelectronic integrated circuit of claim 9, wherein said pins are positioned in two rows.

11. The optoelectronic integrated circuit of claim 9, wherein said first ends of said filaments comprise substantially spherical lenses.

12. A optoelectronic integrated circuit, comprising:
    a socketed optoelectronic circuit board;
    an integrated circuit chip;
    a plurality of optically transmissive filaments having first and second ends, said first ends coupled with said chip; and
    a package having a cavity therein for receiving and encapsulating said chip and said filaments, said filaments positioned such that said second ends of said filaments positioned outside said package for transmitting optical signals, and wherein said second ends are removably insertable into said socketed optoelectronic circuit board.

13. A method of forming an optical connection between a fiber optic filament and an integrated circuit chip, comprising the steps of:
    melting an end of the filament to form a spherical lens; and
    fusing the spherical lens to the chip to form an optical connection between the filament and the chip.

14. The method of claim 13, further comprising the step of forming an optically transmissive layer on the chip prior to said step of fusing and wherein said step of fusing the spherical lens to the chip comprises fusing the lens to the optically transmissive layer.

15. A method of optically connecting a fiber optic filament to an optically active device in an optoelectronic integrated circuit chip, comprising the steps of:
    melting an end of the filament to form a spherical lens;
    forming a silicon dioxide layer over the optically active device;
    fusing the spherical lens to the layer to form an optical connection between the optically active device and the filament.

16. An optoelectronic integrated circuit, comprising:
    an integrated circuit chip;
    a plurality of electrically conductive lead wires coupled to said chip;

a plurality of optically transmissive filaments having first ends thereof coupled to said chip to receive optical transmissions;

an exterior package defining a cavity, said chip being received into said cavity and encapsulated by said package;

a plurality of hollow tubular connecting pins, respective first ends of said pins opening onto said cavity, ones of said electrically conductive lead wires coupled to ones of said connecting pins; and for a plurality of said pins, a filament received into a pin, a first end of said filament disposed in said cavity, a second end of said filament opposite said first end remote from said cavity.

17. In an integrated optoelectronic circuit, an optical coupling comprising:

an optically transmissive filament having an end;

a substantially spherical and transparent lens formed on said end;

an optically active device formed at a face of a semiconductor layer; and an optically transparent layer formed on said face to be fusible with said lens, said lens fused with said transparent layer over said optically active device.

18. The coupling of claim 17, wherein said semiconductor layer comprises gallium arsenide.

19. The coupling of claim 17, wherein said filament comprises a material selected form the group consisting of transparent organic polymers and silicon dioxide.

20. The coupling of claim 19, wherein said filament comprises quartz.

21. The coupling of claim 17, wherein said optically transparent layer comprises silicon dioxide.

22. The coupling of claim 17, wherein said device comprises a laser.

23. The coupling of claim 17, wherein said device comprises a light emitting diode.

24. The coupling of claim 17, and further comprising an epoxy bond affixed to said lens and to said optically transmissive layer to reinforce the connection between said lens and said optically transmissive layer.

25. In an integrated optoelectronic circuit, an optical coupling comprising:

an optically active device formed at a face of a semiconductor layer;

an optically transmissive filament having an end; and a substantially spherical lens formed on said end and fused to said face at said optically active device.

26. The coupling of claim 25, wherein said semiconductor layer is gallium arsenide.

27. The coupling of claim 25, wherein said filament is selected from the group consisting of transparent organic polymers and silicon dioxide.

28. The coupling of claim 27, wherein said filament comprises quartz.

29. The coupling of claim 27, wherein said filament comprises plastic.

30. The coupling of claim 25, wherein said device comprises a laser.

31. The coupling of claim 25, wherein said device comprises a light emitting diode.

32. The coupling of claim 25, wherein said device comprises a photodiode.

33. The coupling of claim 27, wherein said filament comprises an optically clad filament of quartz.

34. The coupling of claim 27, wherein said filament comprises plastic.

* * * * *